United States Patent
Bae et al.

(10) Patent No.: US 10,830,656 B2
(45) Date of Patent: Nov. 10, 2020

(54) OVERMOLDED LEAD FRAME ASSEMBLY FOR PRESSURE SENSING APPLICATIONS

(71) Applicant: SENSATA TECHNOLOGIES, INC., Attleboro, MA (US)

(72) Inventors: Jun H. Bae, Medfield, MA (US); David T. Brown, Antrim (IE); Andrew C. Herron, Tyrone (GB)

(73) Assignee: SENSATA TECHNOLOGIES, INC., Attleboro, MA (US)

( * ) Notice: Subject to any disclaimer, the term of this patent is extended or adjusted under 35 U.S.C. 154(b) by 230 days.

(21) Appl. No.: 15/995,594

(22) Filed: Jun. 1, 2018

(65) Prior Publication Data
US 2019/0368958 A1 Dec. 5, 2019

(51) Int. Cl.
| | |
|---|---|
| *G01L 19/00* | (2006.01) |
| *B81B 7/00* | (2006.01) |
| *B81C 1/00* | (2006.01) |
| *G01L 13/06* | (2006.01) |
| *H01L 23/00* | (2006.01) |

(52) U.S. Cl.
CPC .......... *G01L 19/0084* (2013.01); *B81B 7/007* (2013.01); *B81B 7/0058* (2013.01); *B81C 1/00301* (2013.01); *G01L 13/06* (2013.01); *G01L 19/0069* (2013.01); *H01L 24/48* (2013.01); *B81B 2201/0264* (2013.01); *B81B 2207/015* (2013.01); *B81B 2207/097* (2013.01); *B81C 2203/0154* (2013.01); *B81C 2203/0792* (2013.01); *H01L 2224/48245* (2013.01);
(Continued)

(58) Field of Classification Search
CPC ... G01L 19/0084; G01L 19/14; G01L 19/142; G01L 19/143; G01L 19/147; G01L 19/148; G01D 11/245; G01D 11/30; B23B 31/02; B23B 31/10; B23B 37/00; B23B 2260/128; B23B 2260/1285; B23B 2270/10; B23B 2260/108; B24B 1/04; B23C 2270/10
USPC ................... 73/431, 715, 753, 756
See application file for complete search history.

(56) References Cited

U.S. PATENT DOCUMENTS

| | | |
|---|---|---|
| 5,070,041 A | 12/1991 | Katayama et al. |
| 5,462,622 A | 10/1995 | Small et al. |

(Continued)

FOREIGN PATENT DOCUMENTS

| | | |
|---|---|---|
| EP | 1229317 A2 | 8/2002 |
| EP | 1229317 A3 | 9/2003 |

(Continued)

*Primary Examiner* — Benjamin R Schmitt (57) ABSTRACT

A process of forming an overmolded lead frame assembly for a pressure sensing application includes clamping both sides of a lead frame to performing a primary overmolding operation to prevent resin flash on wire bonding areas on the lead frame. The process also includes performing the primary overmolding operation to form a primary mold that covers selected portions of the lead frame on first and second sides of the lead frame assembly. The primary mold forms an electronics cavity on the first side of the lead frame assembly to enable subsequent wire-bonding of a microelectromechanical system (MEMS) pressure sensing element to the wire bonding areas. The process further includes performing a secondary overmolding operation to form a secondary mold on the second side of the lead frame assembly. The secondary mold covers an exposed portion of the lead frame beneath the wire bonding areas.

20 Claims, 10 Drawing Sheets

(52) U.S. Cl.
CPC ............... *H01L 2924/1433* (2013.01); *H01L 2924/1461* (2013.01)

(56) References Cited

U.S. PATENT DOCUMENTS

| | | |
|---|---|---|
| 5,604,372 A | 2/1997 | Yamaguchi |
| 6,215,174 B1 | 4/2001 | Takada et al. |
| 6,353,257 B1 | 3/2002 | Huang |
| 6,372,551 B1 | 4/2002 | Huang |
| 6,566,740 B2 | 5/2003 | Yasunaga et al. |
| 6,661,089 B2 | 12/2003 | Huang |
| 6,696,752 B2 | 2/2004 | Su et al. |
| 6,696,753 B2 | 2/2004 | Tokuhara |
| 2002/0100331 A1* | 8/2002 | Imai .................... G01L 19/0069 73/753 |
| 2003/0001244 A1 | 1/2003 | Araki et al. |
| 2011/0175598 A1* | 7/2011 | Doering ............... G01D 11/245 324/160 |
| 2015/0244097 A1* | 8/2015 | Hirayama ........... H01R 13/405 439/660 |

FOREIGN PATENT DOCUMENTS

| | | |
|---|---|---|
| EP | 1795496 A2 | 6/2007 |
| EP | 3575765 A1 | 4/2019 |
| WO | 2007149492 A2 | 12/2007 |
| WO | 2007149492 A3 | 5/2008 |

* cited by examiner

OVERMOLDED LEAD FRAME ASSEMBLY FOR PRESSURE SENSING APPLICATIONS

FIELD OF THE INVENTION

The present disclosure relates to lead frame assemblies and more particularly for lead frame assemblies for use in pressure sensing applications.

BACKGROUND OF THE INVENTION

Packaging with a lead frame is known to be cost effective, mostly coming from its high volume density. A lead frame may serve as a conductor to electronically connect a sensing element to electronics. A wire bond, as one of the methods that is used to connect a sensing element to the lead frame, must be free of contamination, including no resin flash/bleed. A thermoset epoxy resin has a good adhesion to a lead frame but is prone to resin flash that can be prevented by clamping both sides of the lead frame. Dual-sided clamping may enable a resin-free area to be achieved for a wire bond surface but results in the other side being left unprotected. In some applications, such as a differential pressure sensing application, an unprotected lead frame can be attacked when exposed to harsh environments, such as exhaust gas or corrosive media. Direct lead frame exposure to such media without additional protective features or different processes could limit the product usage depending on the application environment. Accordingly, there is a need for a process that not only provides protection of wire bond pads on a lead frame from resin flash/bleed but also provides protection for the other side of the lead frame, particularly for lead frames that may be exposed to harsh environments.

SUMMARY OF THE INVENTION

According to one embodiment, a process of forming an overmolded lead frame assembly is disclosed. The process includes, prior to performing a primary overmolding operation of a lead frame assembly that includes a lead frame, clamping both sides of the lead frame to prevent resin flash on wire bonding areas on the lead frame during the primary overmolding operation. The process also includes performing the primary overmolding operation to form a primary mold that covers a first portion of the lead frame on a first side of the lead frame assembly and a second portion of the lead frame on a second side of the lead frame assembly. The primary mold forms an electronics cavity on the first side of the lead frame assembly to enable subsequent wire-bonding of a microelectromechanical system (MEMS) pressure sensing element to the wire bonding areas. The process further includes performing a secondary overmolding operation to form a secondary mold on the second side of the lead frame assembly. The secondary mold covers an exposed portion of the lead frame beneath the wire bonding areas.

The process of the present disclosure addresses the problem that, during a molding process, a thermoset epoxy resin has a tendency that resin flash covers the lead frame, including the wire bonding areas that enable the MEMS pressure sensing element to be wire-bonded to the lead frame. The wire bonding areas should be clean of resin flash to prevent lifting of wire-bonds between the MEMS pressure sensing element and the wire bonding areas. Dual-sided clamping of the lead frame during the molding process may protect the wire bonding areas on the topside of the lead frame from resin flash but may result in exposure of the backside of the lead frame, which may be problematic when the backside is exposed to a harsh environment. The secondary overmolding process protects the exposed backside of the lead frame, enabling the pressure sensing package to be used in various application environments, including harsh environments.

According to another embodiment, an overmolded lead frame assembly for pressure sensing applications is disclosed. The overmolded lead frame assembly includes a lead frame that includes wire bonding areas. A primary mold covers a first portion of the lead frame on a first side of the lead frame assembly and a second portion of the lead frame on a second side of the lead frame assembly. The primary mold forms an electronics cavity on the first side of the lead frame assembly, the electronics cavity configured to receive a MEMS pressure sensing element to be wire-bonded to the wire bonding areas. The overmolded lead frame assembly also includes a secondary mold overlying the primary mold on the second side of the lead frame assembly. The secondary mold covers an exposed portion of the lead frame beneath the wire bonding areas.

According to yet another embodiment, a pressure sensing package is disclosed. The pressure sensing package includes a lead frame assembly having a lead frame that includes wire bonding areas. A primary mold covers a first portion of the lead frame on a first side of the lead frame assembly and a second portion of the lead frame on a second side of the lead frame assembly. The primary mold forms an electronics cavity on the first side of the lead frame assembly. The pressure sensing package also includes a secondary mold overlying the primary mold on the second side of the lead frame assembly. The secondary mold covers an exposed portion of the lead frame beneath the wire bonding areas. The pressure sensing package further includes a MEMS pressure sensing element disposed within the electronics cavity.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

So that those having ordinary skill in the art to which the disclosed technology appertains will more readily understand how to make and use the same, reference may be had to the following drawings.

DETAILED DESCRIPTION

The present disclosure describes a process of forming an overmolded lead frame assembly for pressure sensing applications and a pressure sensing package that includes the overmolded lead frame assembly. A pressure sensing package according to the present disclosure has a construction of a thermoset epoxy resin overmolding a lead frame assembly. In some embodiments, the lead frame assembly has an ASIC (e.g., an ASIC having signal-conditioning circuitry) attached to a lead frame. The process of the present disclosure addresses the problem that, during the molding process, the thermoset epoxy resin has a tendency that resin flash covers the lead frame, including wire bond pads that should be clean to prevent lifting of wire bonds.

Dual-sided clamping of the lead frame during the molding process may protect the wire bond pads on a first side (also referred to herein as the "topside") of the lead frame from resin flash but may result in unwanted exposure of a second side (also referred to herein as the "the backside") of the lead frame. An unprotected lead frame can be attacked when exposed to harsh environments, such as engine exhaust gas or corrosive media, even with a flash gold plating. A thick gold plating would extend the product life against such media but would compromise sealing performance at the joint to the gold-plated lead frame/conductor. Covering such open features with an adhesive may offer limited protection due to the adhesive characteristic and/or dispensing process. Accordingly, the present disclosure utilizes a secondary overmolding process to form a secondary mold that protects the exposed backside of the lead frame. Subsequently, a pressure sensing element (e.g., a MEMS die) may be wire-bonded to the wire bond pads on the topside of the lead frame, with the secondary mold protecting the backside to enable the pressure sensing package to be used in various application environments, including harsh environments.

The advantages, and other features of the systems and methods disclosed herein, will become more readily apparent to those having ordinary skill in the art from the following detailed description of certain preferred embodiments taken in conjunction with the drawings which set forth representative embodiments of the present invention. Like reference numerals are used herein to denote like parts. Further, words defining orientation such as "upper", "lower", "distal", and "proximate" are merely used to help describe the location of components with respect to one another. For example, an "upper" surface of a part is merely meant to describe a surface that is separate from the "lower" surface of that same part. No words denoting orientation are used to describe an absolute orientation (i.e., where an "upper" part must always be on top).

Figure 1:
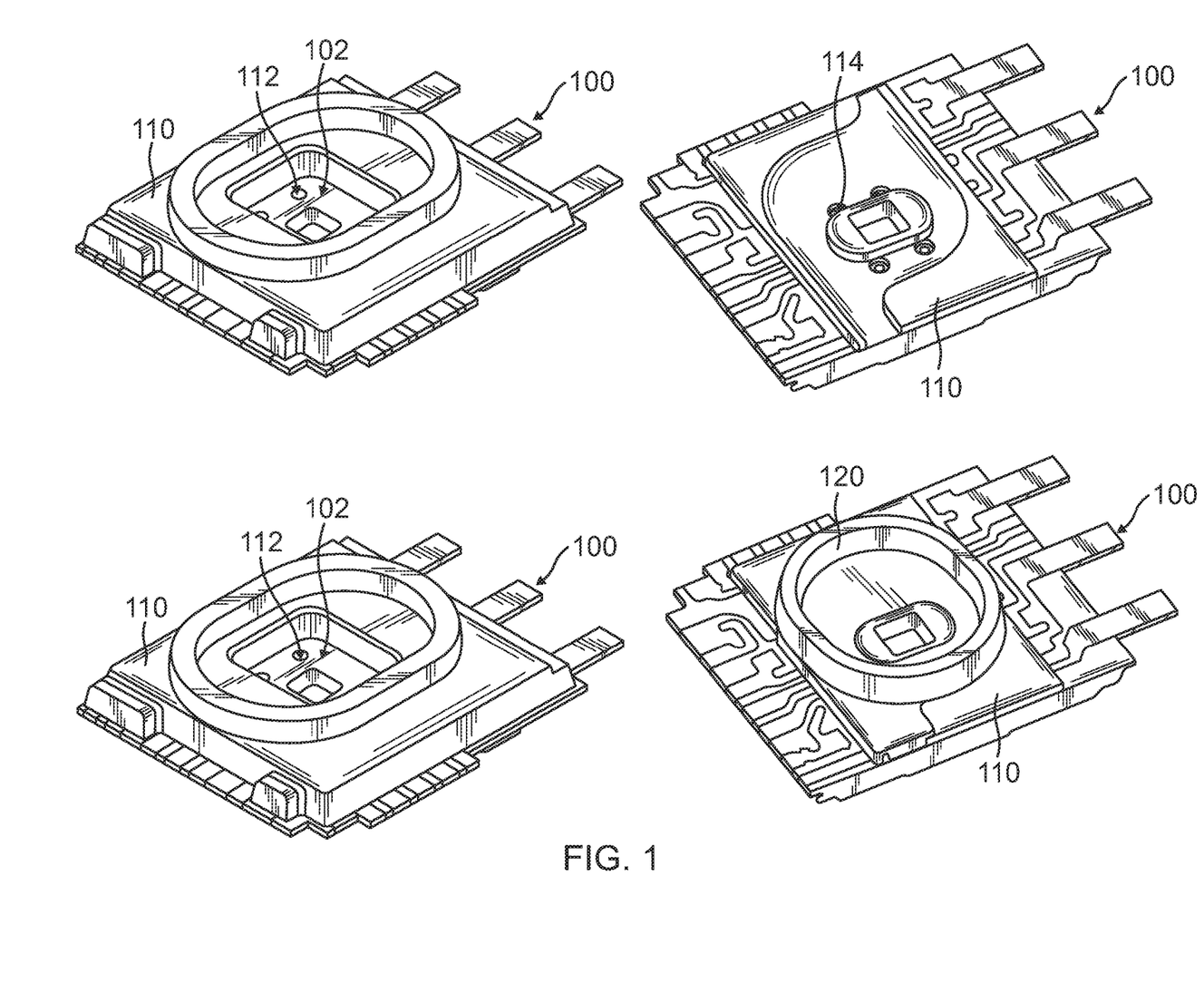
FIG. 1 illustrates various isometric views of an overmolded lead frame assembly after performing overmolding operations on a lead frame assembly, according to one embodiment of the present disclosure.
Figure 2:
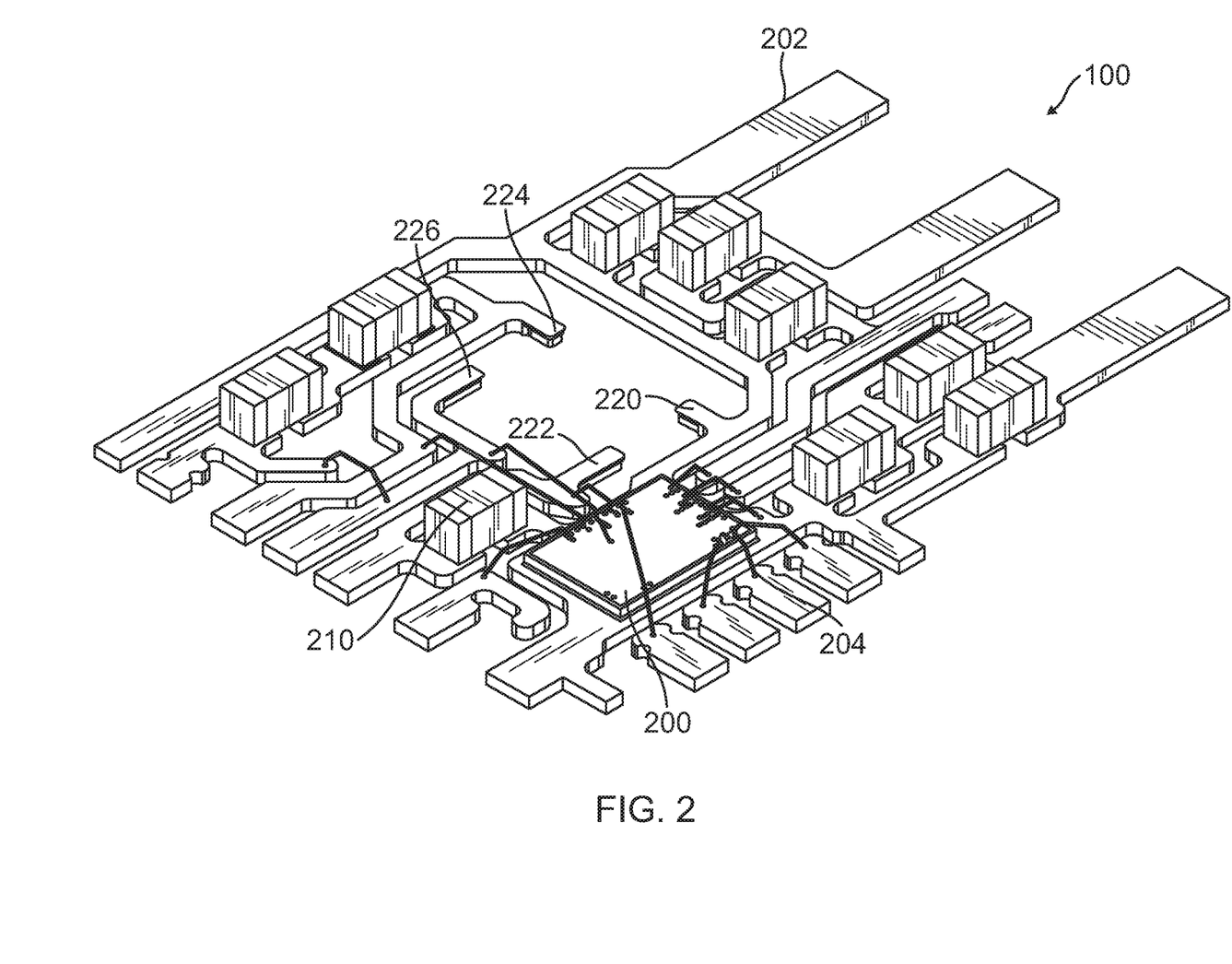
FIG. 2 illustrates an isometric view of a topside of a lead frame assembly with an attached ASIC prior to performing the overmolding operations depicted in FIG. 1, according to one embodiment of the present disclosure.

FIG. 1 illustrates various isometric views of an overmolded lead frame assembly after performing primary and secondary overmolding operations on a lead frame assembly 100, according to one embodiment of the present disclosure. FIG. 2 depicts a detailed view of the lead frame assembly 100 prior to performing the overmolding operations of FIG. 1. FIG. 2 illustrates a particular embodiment in which an ASIC 200 (obscured from view in FIG. 1 as a result of the overmolding operations) is attached to a lead frame 202 of the lead frame assembly 100. In a particular embodiment, the ASIC 200 may correspond to a signal-conditioning ASIC. In other embodiments, such as where a signal-conditioning ASIC is not part of a design specification, the lead frame assembly 100 may include a lead frame but not the attached ASIC. The primary overmolding operation (depicted in the top portion of FIG. 1) is designed to form an electronics cavity 102 on which a pressure sensing element (see e.g. the MEMS pressure sensing element 802 of FIG. 8) is attached and wire-bonded so that the pressure sensing element and the ASIC 200 can be separated according to a design specification, as illustrated and further described herein with respect to FIGS. 8 and 9. The secondary overmolding operation (depicted in the bottom portion of FIG. 1) is designed to cover wire bond pads on the lead frame assembly 100 that are exposed on the backside of the lead frame assembly 100 after the primary overmolding operation.

The top portion of FIG. 1 represents a result of a primary overmolding operation on the lead frame assembly 100 to form a primary mold 110. The left side of the top portion of FIG. 1 depicts an isometric view of a topside of the lead frame assembly 100 after the primary overmolding operation, illustrating selective coverage of the topside of the lead frame assembly 100 by the primary mold 110. The primary mold 110 forms the electronics cavity 102 on the topside of the lead frame assembly 100 for subsequent insertion of the MEMS pressure sensing element 802. The right side of the top portion of FIG. 1 depicts an isometric view of a backside of the lead frame assembly 100 after the primary overmolding operation, illustrating selective coverage of the backside of the lead frame assembly 100 by the primary mold 110.

To prevent resin flash associated with a thermoset epoxy resin, both the topside and the backside of the lead frame assembly 100 are clamped as part of the primary overmolding operation. The dual-sided clamping operation results in "clean" wire bond areas on the topside of the lead frame assembly 100 that are exposed in topside cavities 112 in the primary mold 110, as shown on the left side of the top portion of FIG. 1. The topside cavities 112 are subsequently utilized for attachment of a MEMS pressure sensing element to wire bond areas on the lead frame assembly 100 (see e.g. FIGS. 8 and 9). The primary overmolding operation also results in formation of a pressure through-hole. After attachment of the MEMS pressure sensing element, the pressure through-hole is disposed beneath MEMS pressure sensing element to enable different pressure measurement (see e.g. the pressure through-hole 1006 disposed beneath the MEMS pressure sensing element 802 in FIG. 10).

The dual-sided clamping operation also results in unwanted exposure of the wire bond areas on the backside of the lead frame assembly 100 in backside cavities 114 in the primary mold 110, as shown on the right side of the top portion of FIG. 1. To cover the backside cavities 114 in the primary mold 110, a secondary overmolding operation is performed.

Prior to the secondary overmolding operation, a pre-conditioning operation may be performed to enhance adhesion between the second thermoset epoxy resin and the primary mold 110. In one embodiment, preliminary testing results indicated that no pre-treatment may result in separation of the second molded epoxy resin from the primary mold 110 after the secondary overmolding operation. In this example, C-SAM testing also confirmed severe delamination between the first epoxy resin and the second epoxy resin even when the second molded epoxy resin did not separate from the primary mold 110 after the secondary overmolding process.

Accordingly, in some embodiments, a plasma treatment may be employed after the primary overmolding operation. Two gas types ($H_2$ or an $H_2/O_2$ mixture) were tested, with a 1000-cycle thermal shock (−40° C. to 140° C.) showing satisfactory adhesion between the second epoxy resin and the primary mold 110. Alternatively, in other embodiments, a mechanical treatment (e.g., a sandblast treatment) may be employed after the primary overmolding operation. Testing indicated that initial adhesion appeared satisfactory after a limited 700-cycle thermal shock test. However, such a mechanical treatment is an unclean process and is unsuitable for a clean-room environment. As such, the plasma treatment represents a preferable option to enhance adhesion of the second epoxy resin to the primary mold 110.

The bottom portion of FIG. 1 illustrates that the secondary overmolding operation forms a secondary mold 120 over the primary mold 110 on the backside of the lead frame assembly 100. The secondary mold 120 covers the backside cavities 114 in the primary mold 110, thereby mitigating the unwanted exposure of the wire bond areas on the backside of the lead frame assembly 100 associated with the dual-sided clamping operation. In some cases, the secondary overmolding operation may use the same thermoset epoxy resin as for the primary overmolding operation for improved adhesion. In applications where the secondary mold 120 is exposed to air (and not to a harsh environment, such as exhaust gas or corrosive media), another epoxy resin may be utilized (e.g., such that the secondary mold 120 is transparent). The secondary mold 120 maintains the pressure through-hole formed during the primary overmolding operation to enable different pressure measurement (see e.g. the pressure through-hole 1006 disposed beneath the MEMS pressure sensing element 802 in FIG. 10).

Thus, FIG. 1 illustrates an example of a process of performing a primary overmolding operation to form an epoxy mold to be utilized as an electronics cavity over wire bond areas on a lead frame assembly (having an attached ASIC, in some embodiments). The electronics cavity enables a MEMS pressure sensing element to be attached and wire-bonded so that the MEMS pressure sensing element and the ASIC can be separated according to a design specification for a MEMS sensing package. Dual-sided clamping of the lead frame assembly during the primary overmolding operation protects the wire bond areas from resin flash associated with a thermoset epoxy resin. However, the dual-sided clamping results in an unprotected lead frame on the backside of the overmolded lead frame assembly. Accordingly, FIG. 1 illustrates that a secondary overmolding operation is performed to form a secondary mold that covers the unprotected area on the backside of the lead frame. The primary and secondary overmolding operations thereby enable the MEMS sensing package to be utilized in various application media by protecting the lead frame from being attacked when exposed to harsh environments, such as exhaust gas or corrosive media.

FIG. 2 is an isometric view of the topside of the lead frame assembly 100 prior to performing the overmolding operations of FIG. 1. FIG. 2 illustrates a particular embodiment in which the lead frame assembly 100 includes the ASIC 200 attached to a lead frame 202. While not shown in the example of FIG. 2, in other embodiments the lead frame assembly 100 may a lead frame without an attached ASIC. The primary mold 110 on the topside of the lead frame assembly 110 enables a MEMS pressure sensing element to be separated from the ASIC 200 attached to the lead frame 202, per a design specification. As illustrated and further described herein with respect to FIGS. 8-9, the primary mold 110 forms the electronics cavity 102 for insertion of the MEMS pressure sensing element 802, and the topside cavities 112 in the primary mold 110 provide wire-bonding pathways for electrical connection of the MEMS pressure sensing element 802 to the lead frame 202.

FIG. 2 illustrates that a plurality of ASIC wire-bonds 204 may be used to electrically connect the ASIC 200 to selected areas of the lead frame 202. The ASIC 200 may be attached to the lead frame 202 using an electrically non-conductive adhesive, such as an epoxy die attach adhesive paste. FIG. 2 further illustrates that, in some embodiments, the lead frame assembly 100 may include passive components 210 attached to the lead frame 202. The passive components 210 may be attached to the lead frame 202 using a solder or an electrically conductive adhesive.

Figure 8:
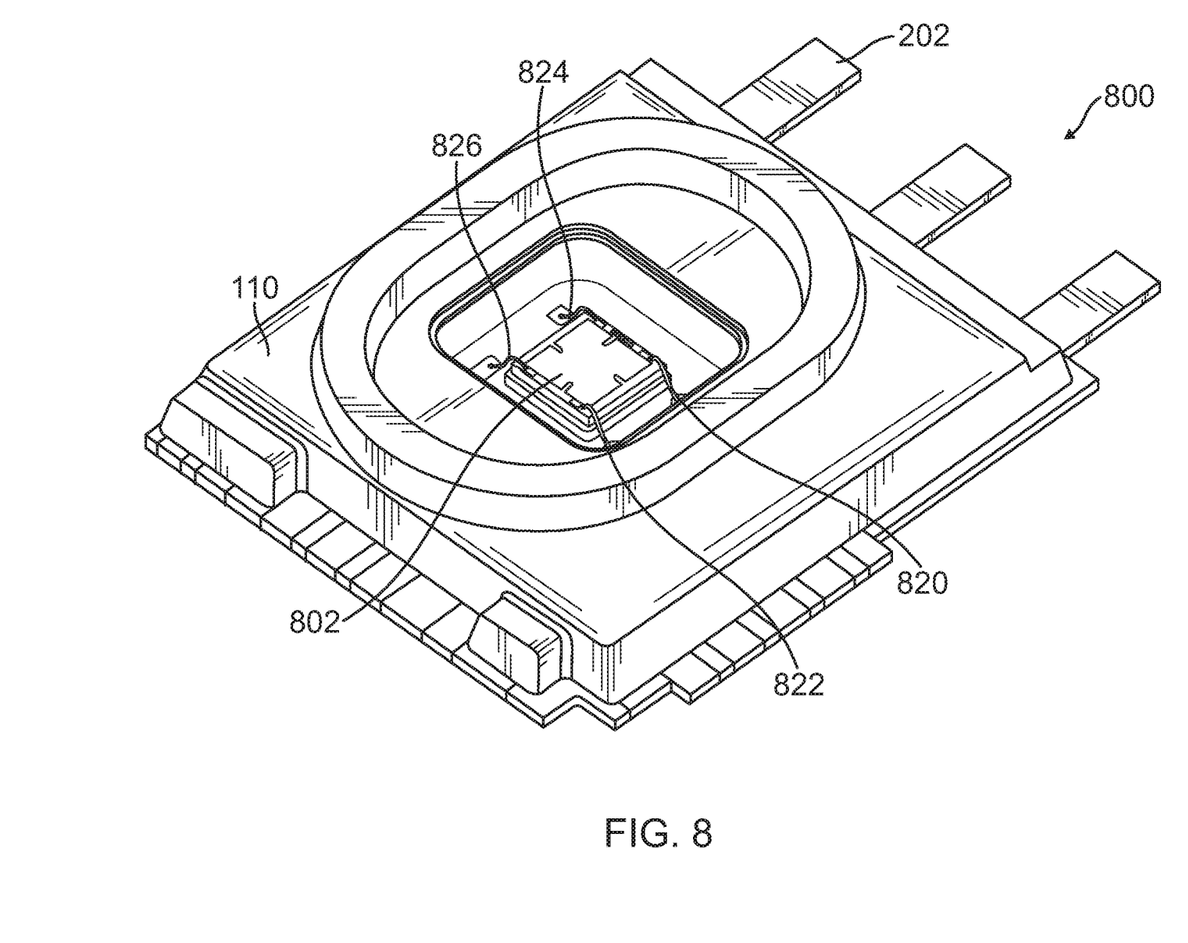
FIG. 8 is an isometric view of a pressure sensing package in which a MEMS pressure sensing element is inserted into an electronics cavity in the primary mold on the topside of the overmolded lead frame assembly after the primary and secondary molding operations.
Figure 9:
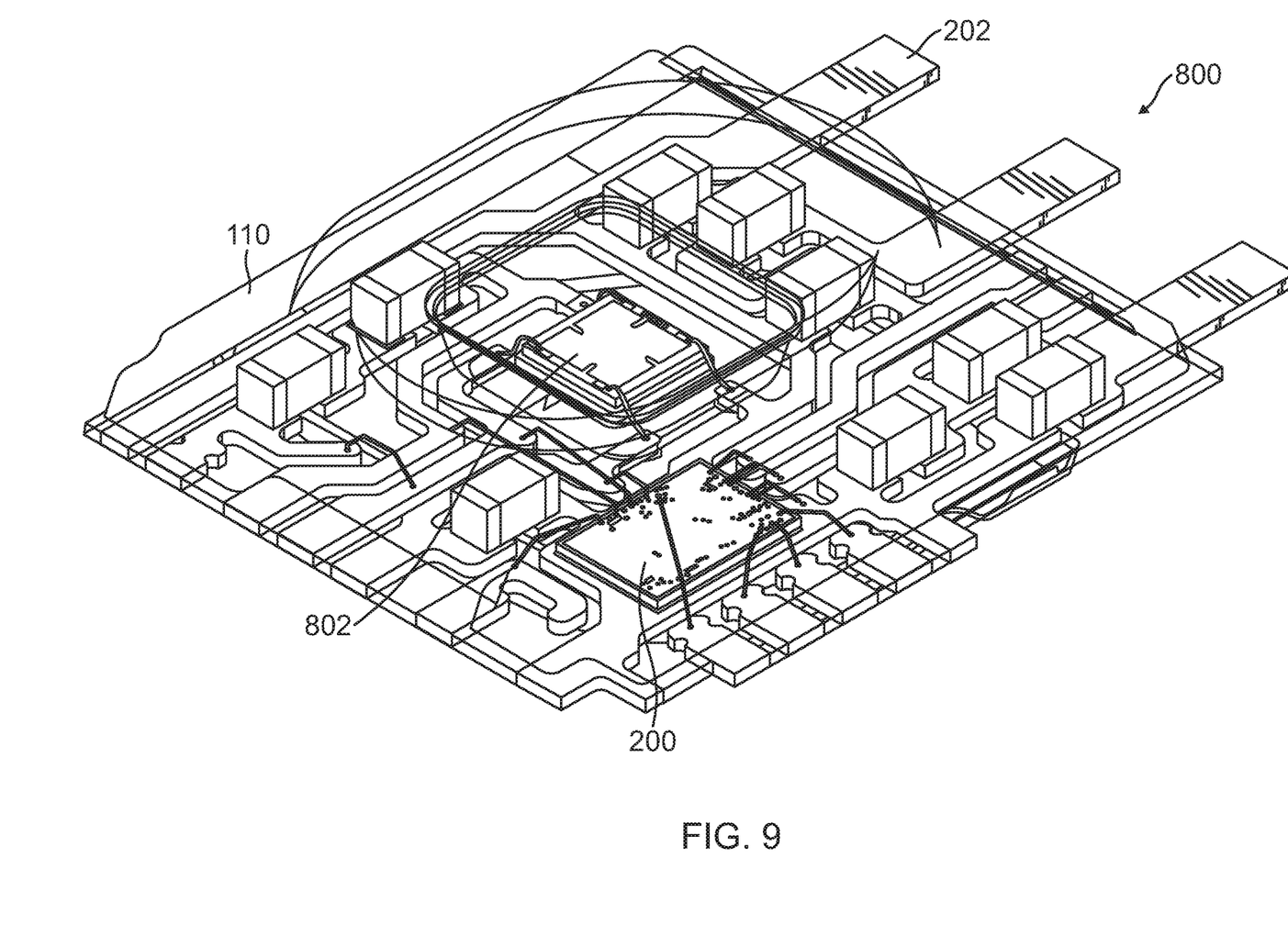
FIG. 9 is an isometric view of the pressure sensing package of FIG. 8, with the primary mold shown transparently to illustrate the separation of the MEMS pressure sensing element from the ASIC by the primary mold.

FIG. 2 further illustrates that the lead frame 202 includes a plurality of wire bonding areas to enable a MEMS pressure sensing element to be electrically connected to the ASIC 200 (see e.g. FIGS. 8 and 9). In the particular embodiment depicted in FIG. 2, the plurality of wire bonding areas includes a first wire bonding area 220, a second wire bonding area 222, a third wire bonding area 224, and a fourth wire bonding area 226. It will be appreciated that the lead frame 202 may include an alternative number and/or arrangement of wire bonding areas.

Figure 3:
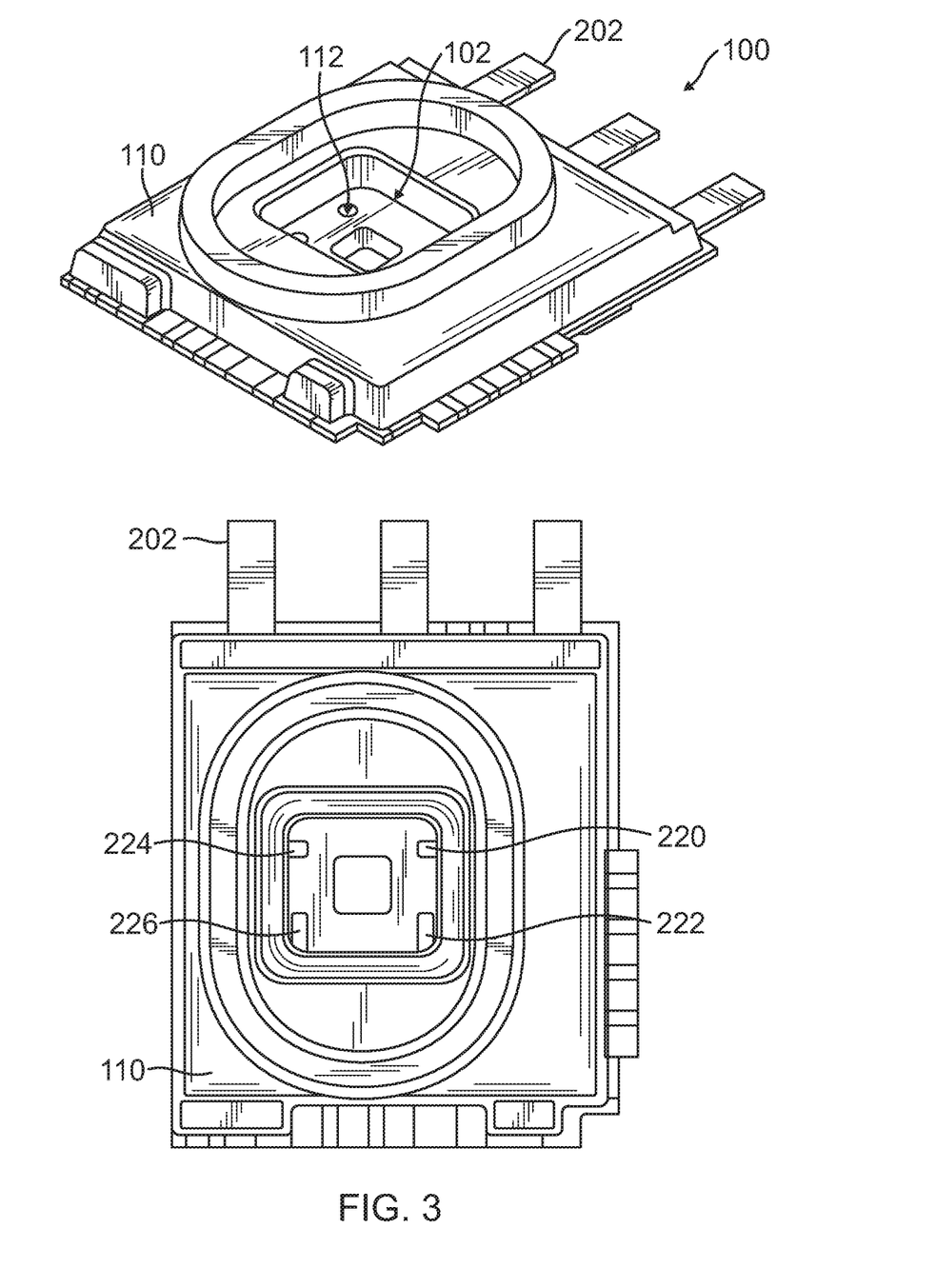
FIG. 3 illustrates an isometric view and a top view of the topside of an overmolded lead frame assembly after performing a primary overmolding operation to form a primary mold on the lead frame assembly with the attached ASIC of FIG. 2.

After the first overmolding operation, the wire bonding areas 220-226 depicted in FIG. 2 are exposed in the electronics cavity 102 on the top side of the primary mold 110 (see e.g. the top view of the topside of the lead frame assembly 100 depicted at the bottom of FIG. 3). The first overmolding operation is a dual-sided clamping operation that protects the wire bonding areas 220-226 from resin flash associated with the thermoset epoxy resin that is used to form the primary mold 110. While protecting the wire bonding areas 220-226 from resin flash, the dual-sided clamping operation results in unwanted exposure of the wire bonding areas 220-226 in the backside cavities 114 of the primary mold 110 (see e.g. the top view of the backside of the lead frame assembly 100 depicted at the bottom of FIG. 4 and the cross-sectional view of FIG. 5).

The first overmolding operation protects the wire bonding areas 220-226 from resin flash. Protection from resin flash prevents subsequent lift-off of the MEMS wire-bonds 820-824 (see FIG. 8) from the wire bonding areas 220-226. After the second overmolding operation, the backside of the wire bonding areas 220-226 that were exposed in the backside cavities 114 of the primary mold 110 are covered by the secondary mold 120 (see e.g. the isometric view of the backside of the lead frame assembly 100 in FIG. 6 and the cross-sectional view of the lead frame assembly 100 in FIG. 7).

Referring to FIG. 3, the top portion depicts an isometric view of the topside of an overmolded lead frame assembly after performing the primary overmolding operation to form the primary mold 110 on the lead frame assembly 100 having the ASIC 200 attached, as depicted in FIG. 2. The bottom portion of FIG. 3 depicts a top view of the topside of the lead frame assembly 100 after performing the primary overmolding operation.

FIG. 3 illustrates that the primary mold 110 forms the electronics cavity 102 for subsequent insertion of a MEMS pressure sensing element. The topside cavities 112 in the primary mold 110 provide electrical connection pathways to the wire bonding areas 220-226 on the lead frame 202. For example, as illustrated and further described herein with respect to FIG. 8, the topside cavities 112 enable the MEMS pressure sensing element 802 to be wire-bonded to the first wire bonding area 220 using a first MEMS wire-bond 820, to the second wire bonding area 222 using a second MEMS wire-bond 822, to the third wire bonding area 224 using a third MEMS wire-bond 824, and to the fourth wire bonding area 226 using a fourth MEMS wire-bond 826.

Figure 4:
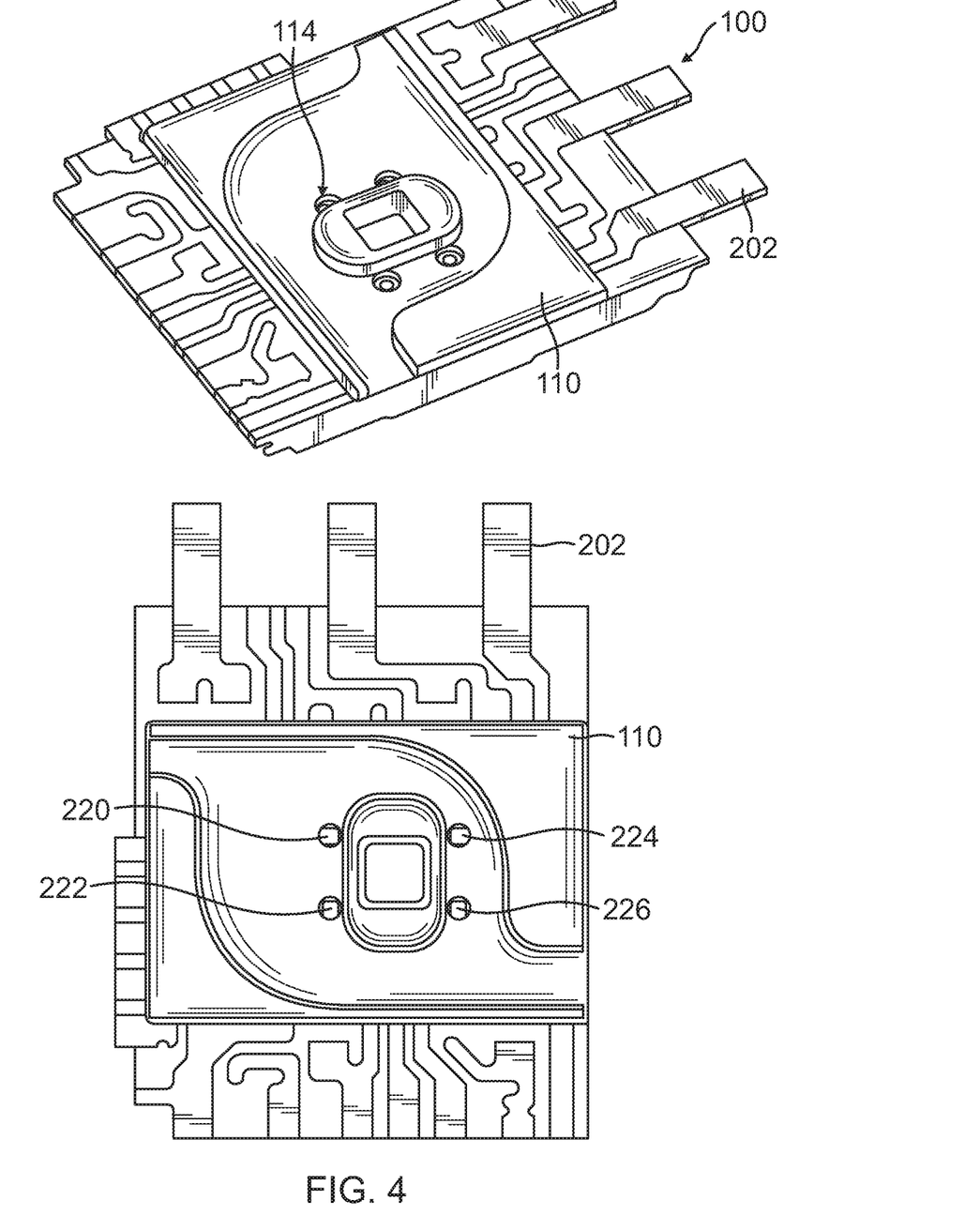
FIG. 4 illustrates an isometric view and a top view of the backside of an overmolded lead frame assembly after performing the primary overmolding operation to form the primary mold on the lead frame assembly with the attached ASIC of FIG. 2.

Referring to FIG. 4, the top portion depicts an isometric view of the backside of the lead frame assembly 100 after performing the primary overmolding operation to form the primary mold 110 on the lead frame assembly 100 (having the ASIC 200 attached, as depicted in FIG. 2). The bottom portion of FIG. 4 depicts a top view of the backside of the lead frame assembly 100 after performing the primary overmolding operation.

FIG. 4 illustrates that the dual-sided clamping of the lead frame assembly 100 results in unwanted exposure of the lead frame 202 on the backside of the lead frame assembly 100. To illustrate, the top view depicted at the bottom of FIG. 4 shows that the backside cavities 114 expose the wire bonding areas 220-226 on the lead frame 202.

Figure 5:
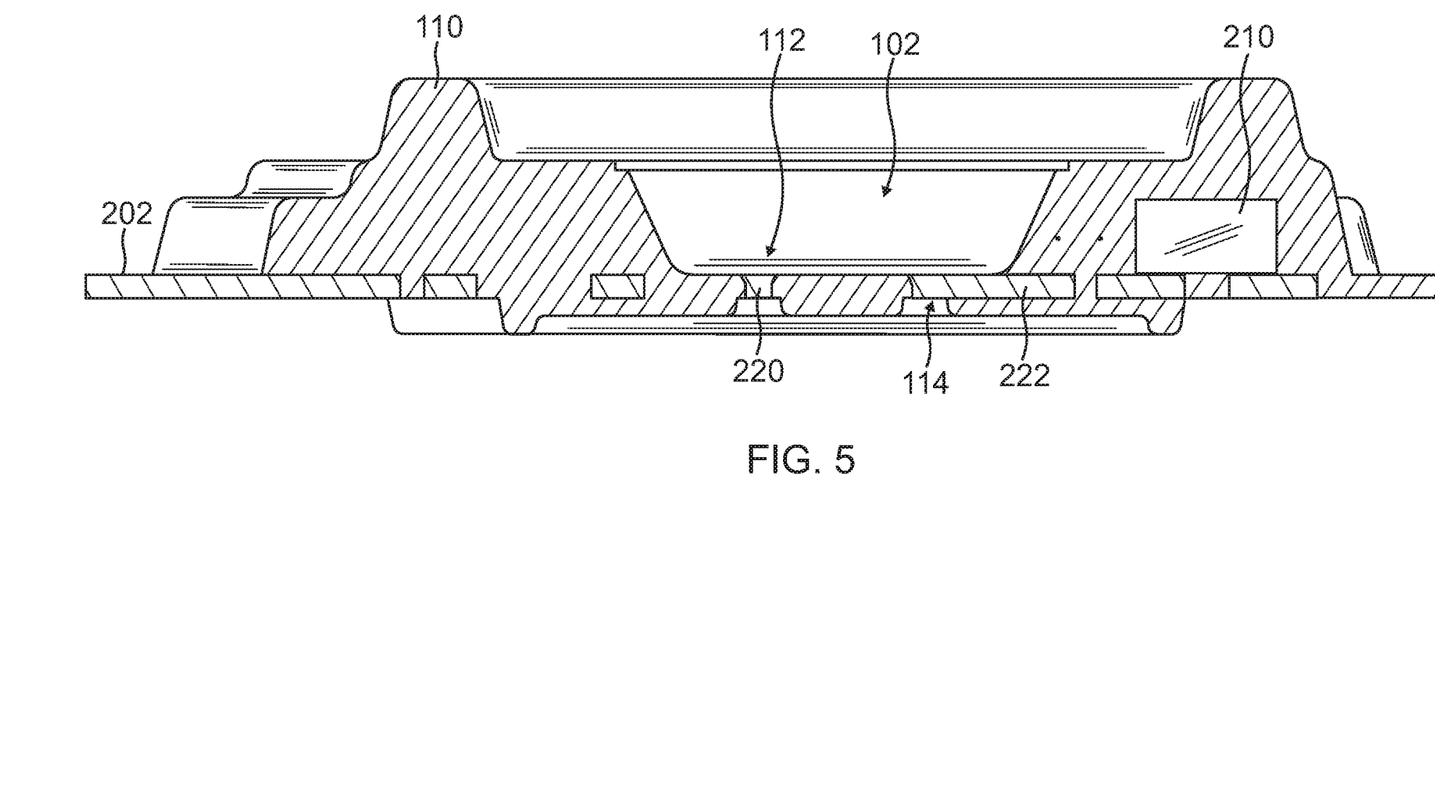
FIG. 5 illustrates a cross-sectional view of the overmolded lead frame assembly depicted in FIGS. 3 and 4.

Referring to FIG. 5, a cross-sectional view depicts a selected portion of the lead frame assembly 100 after the primary overmolding operation to form the primary mold 110.

The selected portion depicted in FIG. 5 illustrates that the primary mold 110 forms the electronics cavity 102 that includes the topside cavities 112 to provide electrical connection pathways to the first wire bonding area 220 and the second wire bonding area 222 on the lead frame 202. For example, as illustrated and further described herein with respect to FIG. 8, the topside cavities 112 enable the MEMS pressure sensing element 802 to be wire-bonded to the first wire bonding area 220 using the first MEMS wire-bond 820 and to the second wire bonding area 222 using the second MEMS wire-bond 822.

FIG. 5 also illustrates that the dual-sided clamping for the primary overmolding operation results in the backside cavities 114 that represent unwanted exposure of backside of the lead frame 202. The selected portion depicted in cross-section in FIG. 5 shows that the backside cavities 114 provide unwanted exposure of the first wire bonding area 220 and the second wire bonding area 222 on the backside of the lead frame 202.

Figure 6:
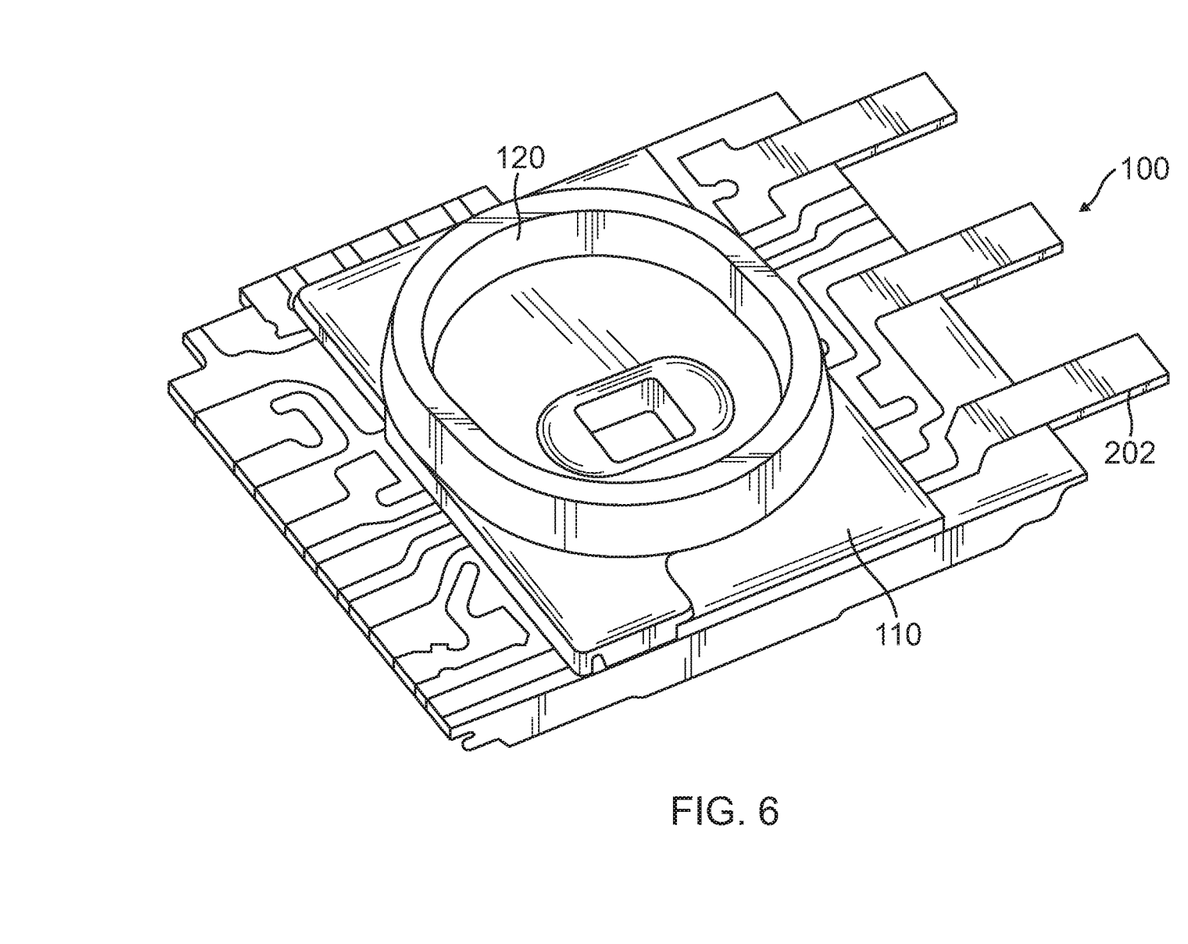
FIG. 6 illustrates an isometric view of the backside of an overmolded lead frame assembly after performing a secondary overmolding operation to form a secondary mold on the overmolded lead frame assembly depicted in FIGS. 3-5.
Figure 7:
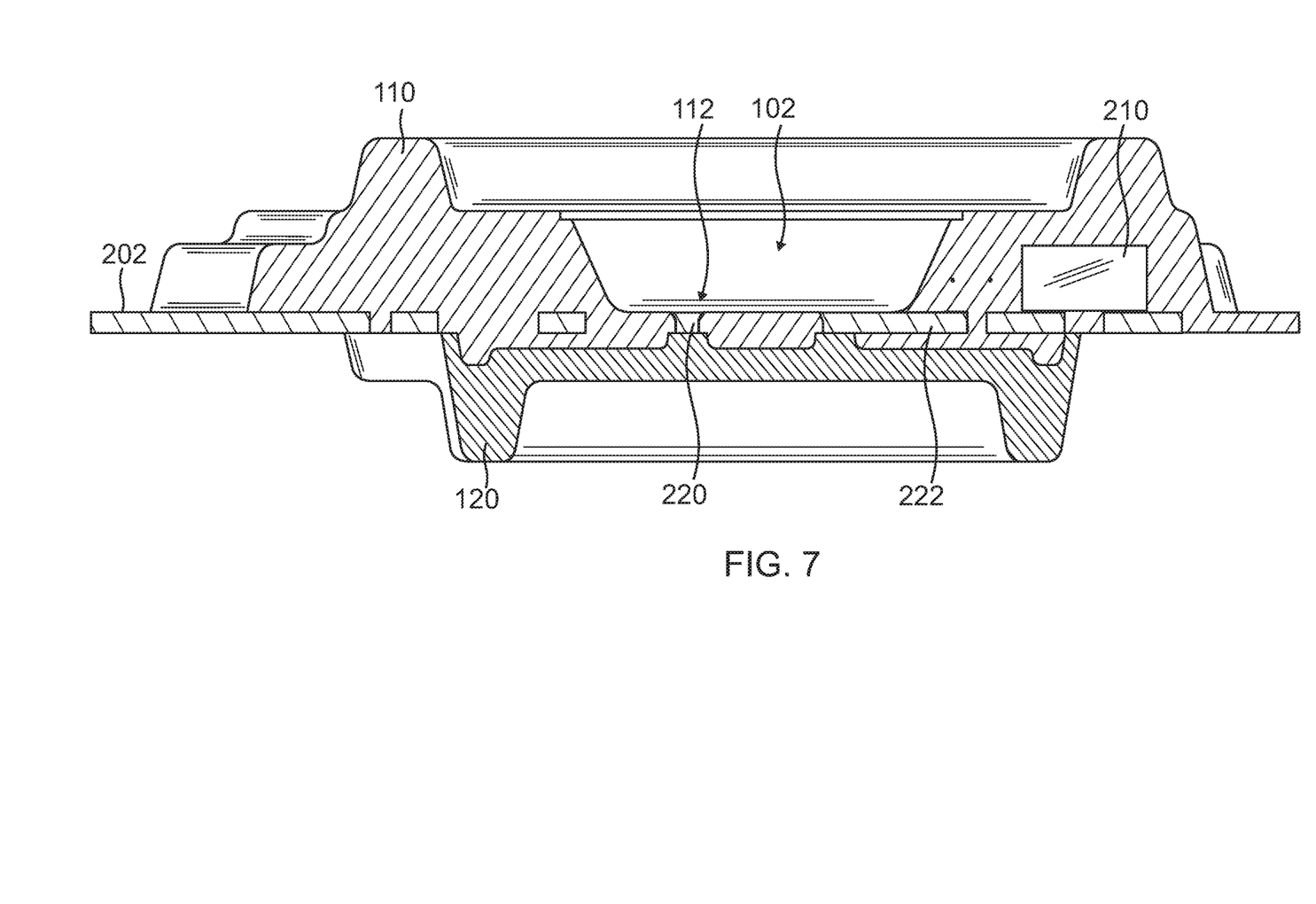
FIG. 7 illustrates a cross-sectional view of the overmolded lead frame assembly depicted in FIG. 6.

FIGS. 6 and 7 illustrate the secondary overmolding operation to cover the exposed backside of the lead frame 202 that results from the dual-sided clamping to prevent resin flash on the wire bonding areas 220-226. FIG. 6 is an isometric view of the backside of the lead frame assembly 100 after performing the secondary overmolding operation to form the secondary mold 120 overlying the primary mold 110 on the lead frame assembly 100 depicted in FIGS. 3-5. FIG. 7 illustrates a cross-sectional view of the lead frame assembly 100 depicted in FIG. 6. FIGS. 6 and 7 illustrate that the secondary mold 120 covers the backside cavities 114 on the primary mold 110 to remedy the unwanted exposure of the wire bonding areas 220-226 on the backside of the lead frame 202.

FIG. 8 is an isometric view of a pressure sensing package 800 (also referred to as a "chip-on-board assembly") in which a MEMS pressure sensing element 802 is inserted into the electronics cavity 102.

FIG. 8 illustrates that the MEMS pressure sensing element 802 may be wire-bonded to the lead frame 202 using multiple MEMS wire-bonds through the topside cavities 112 in the primary mold 110. In FIG. 8, a first MEMS wire-bond 820 provides a first electrical connection from the MEMS pressure sensing element 802 to the first wire bonding area 220 on the lead frame 202. A second MEMS wire-bond 822 provides a second electrical connection from the MEMS pressure sensing element 802 to the second wire bonding area 222 on the lead frame 202, a third MEMS wire-bond 824 provides a third electrical connection from the MEMS pressure sensing element 802 to the third wire bonding area 224 on the lead frame 202, and a fourth MEMS wire-bond 826 provides a fourth electrical connection from the MEMS pressure sensing element 802 to the fourth wire bonding area 226 on the lead frame 202.

FIG. 9 is an isometric view of the pressure sensing package 800 of FIG. 8, with the primary mold 110 shown transparently to further illustrate the connection of the MEMS pressure sensing element 802 to the lead frame 202 having the ASIC 200 attached. The primary mold 110 separates the MEMS pressure sensing element 802 from the ASIC 200 per a design specification.

Figure 10:
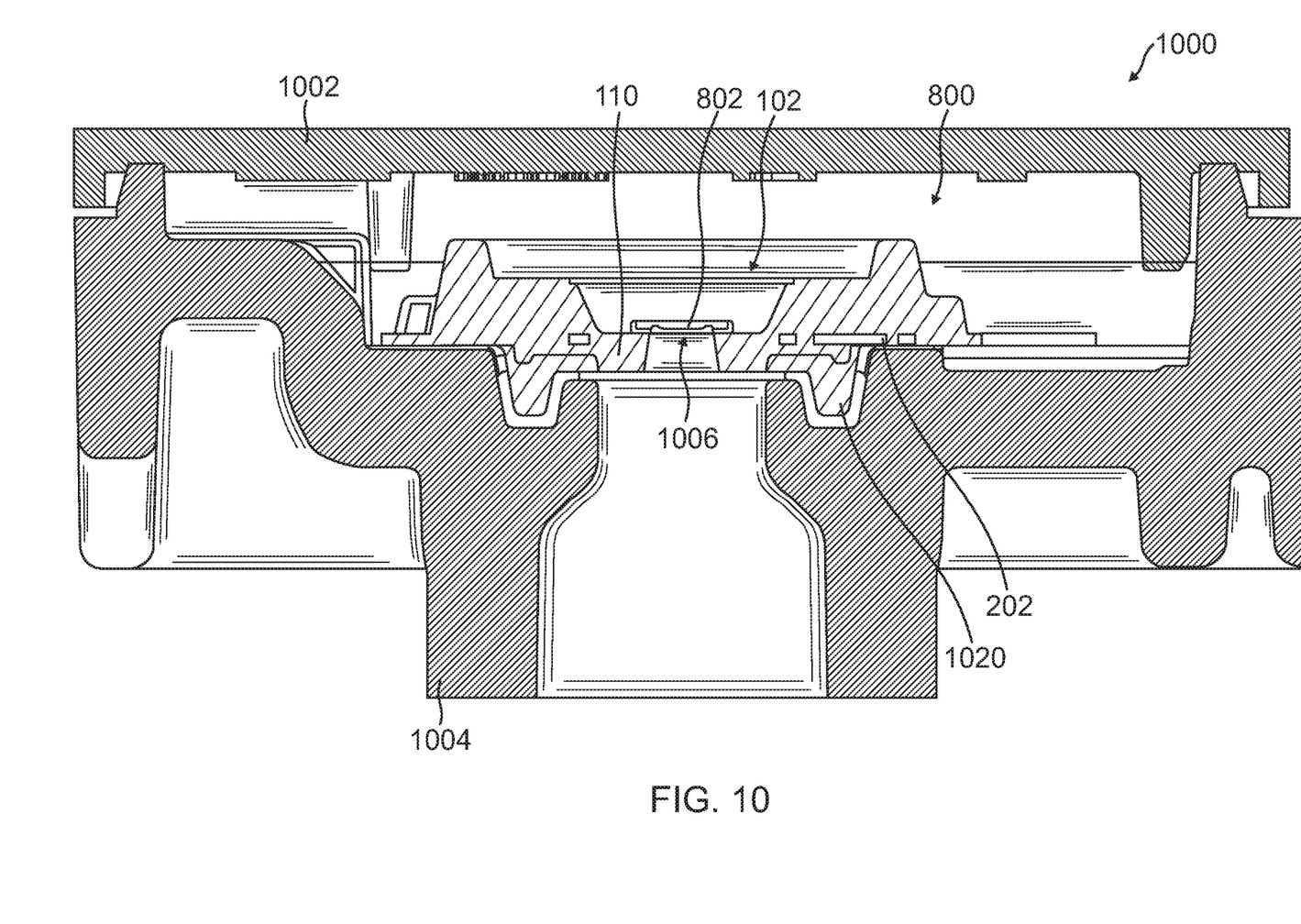
FIG. 10 is a cross-sectional view of a selected portion of a pressure sensor for determining relative/differential pressure, including the pressure sensing package depicted in FIGS. 8 and 9.

FIG. 10 is a cross-sectional view of a selected portion of a pressure sensor 1000 for relative/differential pressure sensing including the pressure sensing package 800 depicted in FIGS. 8 and 9. In the example depicted in FIG. 10, the pressure sensor 1000 includes a lid 1002 for protection of the pressure sensing package 800 after positioning the pressure sensing package 800 over a housing port 1004.

During operation, the pressure sensor 1000 of FIG. 10 is positioned to enable differential pressure measurement by the MEMS pressure sensing element 802. To determine the differential pressure measurement, FIG. 10 illustrates that a top side of the MEMS pressure sensing element 802 (i.e., the side facing the lid 1002 of the pressure sensor 1000) is exposed within the electronics cavity 102 to a first pressure. A bottom side of the MEMS pressure sensing element 802 is exposed to a second pressure via a pressure thru-hole 1006 extending through the primary mold 110 (and the secondary mold) into the housing port 1004 to enable differential pressure measurement. FIG. 10 illustrates that, in some embodiments, a protective material 1020 (e.g., a gel or an adhesive) may be disposed beneath exposed pins of the lead frame 202 to protect the lead frame 202 from a harsh environment.

It will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may be dependent from any or all claims in a multiple dependent manner even though such has not been originally claimed.

What is claimed is:

1. A process of forming an overmolded lead frame assembly for a pressure sensing application, the process comprising:
    performing a primary overmolding operation that includes overmolding a frontside and a backside of a lead frame with a first mold while clamping the lead frame at both the frontside and the backside of a wire bonding area on the lead frame, wherein clamping the lead frame at the wire bonding area prevents the frontside and the backside of the wire bonding area from being covered by the first mold during the primary overmolding operation and creates:
        an electronics cavity that provides an opening within the first mold that exposes the frontside of the wire bonding area for subsequent wire-bonding of a microelectromechanical system (MEMS) pressure sensing element to the frontside of the wire bonding area; and
        a pressure through-hole for placement of the MEMS pressure sensing element; and
    performing a secondary overmolding operation that includes overmolding, with a second mold, a portion of a backside of the first mold and the backside of the wire bonding area that was prevented from being covered by the first mold, by clamping the frontside and the backside of the wire bonding area during the primary overmolding operation, while preventing the pressure through-hole from being covered by the second mold during the secondary overmolding operation.

2. The process of claim 1, wherein the lead frame assembly includes an application-specific integrated circuit (ASIC) attached to the lead frame.

3. The process of claim 1, further comprising prior to performing the secondary overmolding operation, performing a pre-conditioning operation on a portion of a backside of the first mold and the backside of the wire bonding area that was prevented from being covered by the first mold, by clamping the frontside and the backside of the wire bonding area during the primary overmolding operation.

4. The process of claim 3, wherein the pre-conditioning operation includes a plasma treatment.

5. The process of claim 4, wherein the plasma treatment utilizes hydrogen ($H_2$) gas or a mixture of hydrogen ($H_2$) gas and oxygen ($O_2$) gas.

6. The process of claim 1, wherein the primary overmolding operation utilizes a thermoset epoxy resin to form the first mold, and wherein the secondary overmolding operation utilizes the same thermoset epoxy resin to form the second mold.

7. The process of claim 1, wherein the primary overmolding operation utilizes a first thermoset epoxy resin to form the first mold, and wherein the secondary overmolding operation utilizes a second thermoset epoxy resin that is different from the first thermoset epoxy resin to form the second mold.

8. The process of claim 1, wherein the primary overmolding operation results in formation of:
    topside cavities that extend through the first mold from the electronics cavity to the wire bonding areas, the topside cavities providing electrical connection pathways for MEMS wire-bonds between the MEMS pressure sensing element and the wire bonding areas; and
    backside cavities that extend through the first mold to the exposed portion of the lead frame beneath the wire bonding areas.

9. The process of claim 8, wherein the second mold covers the backside cavities but does not cover the topside cavities.

10. The process of claim 8, wherein the second mold maintains the pressure through-hole.

11. An overmolded lead frame assembly for pressure sensing applications, the overmolded lead frame assembly comprising:
    a lead frame assembly that includes a lead frame, wherein the lead frame includes wire bonding areas;
    a first mold covering a frontside and a backside of the lead frame, the first mold formed by a primary overmolding operation that overmolded the frontside and the backside of the lead frame with the first mold while the lead frame was clamped at both the frontside and the backside of the wire bonding area on the lead frame, wherein clamping the lead frame at the wire bonding area prevented the frontside and the backside of the wire bonding area from being covered by the first mold during the primary overmolding operation and created:
        an electronics cavity that provides an opening within the first mold that exposes the frontside of the wire bonding area for subsequent wire-bonding of a microelectromechanical system (MEMS) pressure sensing element to the frontside of the wire bonding area; and
        a pressure through-hole for placement of the MEMS pressure sensing element; and
    a second mold that was formed by a secondary overmolding operation that overmolded, with the second mold, a portion of a backside of the first mold and the backside of the wire bonding area that was prevented from being covered by the first mold, by clamping the frontside and the backside of the wire bonding area during the primary overmolding operation, while preventing the pressure through-hole from being covered by the second mold during the secondary overmolding operation.

12. The overmolded lead frame assembly of claim 11, wherein the lead frame assembly includes an application-specific integrated circuit (ASIC) attached to the lead frame.

13. The overmolded lead frame assembly of claim 11, wherein the first mold is formed from a thermoset epoxy resin, and wherein the second mold is formed from the same thermoset epoxy resin.

14. The overmolded lead frame assembly of claim 11, wherein the first mold is formed from a first thermoset epoxy resin, and wherein the second mold is formed from a second thermoset epoxy resin that is different from the first thermoset epoxy resin.

15. The overmolded lead frame assembly of claim 11, wherein the first mold forms the pressure through-hole beneath the MEMS pressure sensing element to enable differential pressure measurement, and wherein the second mold maintains the pressure through-hole.

16. A pressure sensing package comprising:
    a lead frame assembly that includes a lead frame, wherein the lead frame includes wire bonding areas;
    a first mold covering a frontside and a backside of the lead frame, the first mold formed by a primary overmolding operation that overmolded the frontside and the backside of the lead frame with the first mold while the lead frame was clamped at both the frontside and the backside of the wire bonding area on the lead frame, wherein clamping the lead frame at the wire bonding area prevented the frontside and the backside of the wire bonding area from being covered by the first mold during the primary overmolding operation and created:
- an electronics cavity that provides an opening within the first mold that exposes the frontside of the wire bonding area for subsequent wire-bonding of a microelectromechanical system (MEMS) pressure sensing element to the frontside of the wire bonding area; and
- a pressure through-hole for placement of the MEMS pressure sensing element; and a second mold that was formed by a secondary overmolding operation that overmolded, with the second mold, a portion of a backside of the first mold and the backside of the wire bonding area that was prevented from being covered by the first mold, by clamping the frontside and the backside of the wire bonding area during the primary overmolding operation, while preventing the pressure through-hole from being covered by the second mold during the secondary overmolding operation; and the MEMS pressure sensing element disposed within the electronics cavity.

17. The pressure sensing package of claim 16, wherein the lead frame assembly includes an application-specific integrated circuit (ASIC) attached to the lead frame.

18. The pressure sensing package of claim 17, wherein the ASIC includes signal-conditioning circuitry.

19. The pressure sensing package of claim 16, wherein the first mold forms the pressure through-hole beneath the MEMS pressure sensing element to enable differential pressure measurement, and wherein the second mold maintains the pressure-through hole.

20. The pressure sensing package of claim 16, wherein the second mold protects the exposed portion of the lead frame beneath the wire bonding areas from engine exhaust gas or corrosive media.

* * * * *